US012153318B2

(12) United States Patent
Yu et al.

(10) Patent No.: US 12,153,318 B2
(45) Date of Patent: Nov. 26, 2024

(54) ARRAY SUBSTRATE AND DISPLAY PANEL

(71) Applicant: Wuhan China Star Optoelectronics Technology Co., Ltd., Hubei (CN)

(72) Inventors: Wenqiang Yu, Hubei (CN); Chao Wang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/772,199

(22) PCT Filed: Mar. 31, 2022

(86) PCT No.: PCT/CN2022/084371
§ 371 (c)(1),
(2) Date: Apr. 27, 2022

(87) PCT Pub. No.: WO2023/173499
PCT Pub. Date: Sep. 21, 2023

(65) Prior Publication Data
US 2024/0142838 A1 May 2, 2024

(30) Foreign Application Priority Data
Mar. 16, 2022 (CN) .......................... 202210259471.9

(51) Int. Cl.
*G02F 1/1368* (2006.01)
*G02F 1/1333* (2006.01)
(Continued)

(52) U.S. Cl.
CPC ...... *G02F 1/1368* (2013.01); *G02F 1/136286* (2013.01); *H01L 27/124* (2013.01); *G02F 1/133345* (2013.01)

(58) Field of Classification Search
CPC ............ G02F 1/1333; G02F 1/133345; G02F 1/133357; G02F 1/1343; G02F 1/134309;
(Continued)

(56) References Cited

U.S. PATENT DOCUMENTS 9,941,303 B1 4/2018 Zhou
10,558,097 B2 * 2/2020 Miyamoto .......... H01L 27/1248
10,756,120 B2 * 8/2020 Hong .................. G02F 1/13306

FOREIGN PATENT DOCUMENTS

CN 106950772 7/2017
CN 107490917 12/2017
(Continued)

OTHER PUBLICATIONS

Patent Translate CN 114068590 (Feb. 18, 2022).*
(Continued)

*Primary Examiner* — Thoi V Duong

(57) ABSTRACT

Embodiment of the present application discloses an array substrate and a display panel. An active layer includes a first connection segment, a second connection segment, and a third connection segment connected in sequence. A part of the second connection segment of the active layer overlaps with a data line, and another part of the second connection segment locates between two adjacent data lines. The third connection segment locates between the two adjacent data lines. A drain electrode contacts a part of the active layer exposed between the two adjacent data lines.

16 Claims, 10 Drawing Sheets

(51) Int. Cl.
*G02F 1/1362* (2006.01)
*H01L 27/12* (2006.01)

(58) Field of Classification Search
CPC ......... G02F 1/134318; G02F 1/134363; G02F
1/1362; G02F 1/136227; G02F 1/136286;
G02F 1/1368; G02F 1/13685; H01L
27/124
See application file for complete search history.

(56) References Cited

FOREIGN PATENT DOCUMENTS

| | | | | |
|---|---|---|---|---|
| CN | 110190072 | | 8/2019 | |
| CN | 112782895 | | 5/2021 | |
| CN | 114068590 B | * | 6/2022 | ........... G02F 1/1362 |

OTHER PUBLICATIONS

International Search Report and the Written Opinion Dated Nov. 25, 2022 From the International Searching Authority Re. Application No. PCT/CN2022/084371 and Its Translation Into English. (15 Pages).

* cited by examiner

ARRAY SUBSTRATE AND DISPLAY PANEL

RELATED APPLICATIONS

This application is a National Phase of PCT Patent Application No. PCT/CN2022/084371 having International filing date of Mar. 31, 2022, which claims the benefit of priority of Chinese Patent Application No. 202210259471.9 filed on Mar. 16, 2022. The contents of the above applications are all incorporated by reference as if fully set forth herein in their entirety.

FIELD AND BACKGROUND OF THE INVENTION

The present application relates to the technical field of display, and especially to an array substrate and a display panel.

With development of science and technology, a concept of metaverse has entered people's vision. The metaverse is a virtual world that is linked and created by scientific and technological means, a virtual world that maps and interacts with a real world, and a digital living space with a new social system. As the concept of the metaverse continues to be hot, it has attracted strong attentions from capital and market. As a development direction of next-generation internet, it attracts all parties to develop software and hardware. Among them, micro display screens are bases for interaction of the hardware such as virtual reality (VR) devices and augmented reality (AR) devices, and they are also one of core technologies to enter the "metaverse".

The micro display screens determine resolution of the VR devices and a degree of dizziness. In order to improve display clarity of the VR devices, it is necessary to increase resolution of screens and add more pixels. In order to improve the resolution of the screens, pixel pitches need to be reduced as much as possible; correspondingly, a shading area of an array substrate also needs to be reduced as much as possible. For example, data lines, scan lines, thin film transistors, etc. need to be reduced as much as possible.

However, when size of the thin film transistors is compressed to an extreme, an active layer of the thin film transistors will also shrink; accordingly, part of the active layer extending below a drain electrode will also become smaller. At this time, a contact area between the drain electrode and the active layer below the drain electrode is smaller, and this leads to high contact resistance between the drain electrode and the active layer and reduces a responding speed of the thin film transistors.

SUMMARY OF THE INVENTION

Embodiments of the present application provide an array substrate and a display panel, which can solve a technical problem of high contact resistance between a drain electrode and an active layer of a thin film transistor, resulting in a slow responding speed of the thin film transistor.

An embodiment of the present application provide an array substrate, includes:
a plurality of data lines;
an active layer, arranged in a different layer from the data lines, the active layer including a first connection segment, a second connection segment, and a third connection segment connected in sequence, the first connection segment overlapping with the data line in a direction perpendicular to the array substrate, the third connection segment locating between two adjacent data lines, the second connection segment connecting with the first connection segment and the third connection segment, the second connection segment partially overlapping with the data line in the direction perpendicular to the array substrate;
a gate electrode, arranged in a different layer from the data lines and the active layer, the gate electrode overlapping with the active layer in the direction perpendicular to the array substrate;
a source electrode, connecting with the data line, the source electrode contacting with the first connection segment; and
drain electrode, arranged at intervals from the data line and the source electrode, the drain electrode overlapping with a part of the active layer exposed between the two adjacent data lines in the direction perpendicular to the array substrate, the drain electrode contacting with the part of the active layer exposed between the two adjacent data lines.

Optionally, in some embodiments of the present application, the second connection segment is linear, extending direction of the second connection segment intersects with extending direction of the data line.

Optionally, in some embodiments of the present application, an inclined angle between the extending direction of the second connection segment and the extending direction of the data line is 7°-22°.

Optionally, in some embodiments of the present application, the second connection segment includes a plurality of sub-connection segments connected in sequence.

Optionally, in some embodiments of the present application, the sub-connection segment is linear, extending direction of the sub-connection segment intersects with the extending direction of the data line.

Optionally, in some embodiments of the present application, inclined angles are formed between the extending directions of the sub-connection segments and the extending direction of the data line, the inclined angles of the plurality of sub-connection segments gradually increase from direction of the first connection segment to the third connection segment.

Optionally, in some embodiments of the present application, area ratio of parts of the sub-connection segments extending between the two adjacent data lines to the corresponding sub-connection segments gradually increases from the direction of the first connection segment toward the third connection segment.

Optionally, in some embodiments of the present application, the included angles between the extending directions of the sub-connection segments and the extending direction of the data line are 7°-22°.

Optionally, in some embodiments of the present application, the second connection segment is arc-shaped.

Optionally, in some embodiments of the present application, an insulating layer is disposed between the drain electrode and the data line, a part of the drain electrode overlaps with the adjacent data line.

Optionally, in some embodiments of the present application, the source electrode and the data line are arranged in a same layer, the drain electrode and the data line are arranged in different layers.

Optionally, in some embodiments of the present application, the array substrate further includes a substrate, a gate insulating layer, a first interlayer insulating layer, and a second interlayer insulating layer; the active layer is disposed on the substrate, the gate insulating layer covers the active layer, the gate electrode is disposed on the gate insulating layer, the first interlayer insulating layer covers the gate electrode, the source electrode is disposed on the first interlayer insulating layer, the second interlayer insulating layer covers the source electrode, and the drain electrode is disposed on the second interlayer insulating layer.

Optionally, in some embodiments of the present application, the gate insulating layer and the first interlayer insulating layer are provided with a first via hole, the source electrode contacts with the first connection segment through the first via hole;

the gate insulating layer, the first interlayer insulating layer, and the second interlayer insulating layer are provided with a second via hole, the drain electrode contacts with the third connection segment through the second via hole.

Optionally, in some embodiments of the present application, the array substrate further includes a first planarization layer, a pixel electrode, a protective layer, and a common electrode; the first planarization layer covers the drain electrode and the second interlayer insulating layer, the pixel electrode is disposed on the first planarization layer and contacts with the drain electrode, the protective layer covers the pixel electrode and the first planarization layer, the common electrode is disposed on the protective layer.

Optionally, in some embodiments of the present application, the first planarization layer is provided with a third via hole, the pixel electrode contacts with the drain electrode through the third via hole.

Optionally, in some embodiments of the present application, the array substrate further includes a substrate, a gate insulating layer, a first interlayer insulating layer, and a second interlayer insulating layer; the active layer is disposed on the substrate, the gate insulating layer covers the active layer, the gate electrode is disposed on the gate insulating layer, the first interlayer insulating layer covers the gate electrode, the drain electrode is disposed on the first interlayer insulating layer, the second interlayer insulating layer covers the drain electrode, and the source electrode is disposed on the second interlayer insulating layer.

Optionally, in some embodiments of the present application, the gate insulating layer, the first interlayer insulating layer, and the second interlayer insulating layer are provided with a first via hole, the source electrode contacts with the first connection segment through the first via hole;

the gate insulating layer and the first interlayer insulating layer are provided with a second via hole, the drain electrode contacts with the third connection segment through the second via hole.

Optionally, in some embodiments of the present application, the array substrate further includes a first planarization layer, a pixel electrode, a protective layer, and a common electrode; the first planarization layer covers the source electrode and the second interlayer insulating layer, the pixel electrode is disposed on the first planarization layer and contacts with the drain electrode, the protective layer covers the pixel electrode and the first planarization layer, the common electrode is disposed on the protective layer.

Optionally, in some embodiments of the present application, the second interlayer insulating layer and the first planarization layer are provided with a third via hole, the pixel electrode contacts with the drain electrode through the third via hole.

Optionally, in some embodiments of the present application, distance between the two adjacent data lines is less than 7 microns.

An embodiment of the present application further provides a display panel, includes a liquid crystal layer, an opposite substrate, and the array substrate as described above; the array substrate and the opposite substrate are arranged opposite to each other, the liquid crystal layer is disposed between the array substrate and the opposite substrate.

The embodiment of the present application adopts the array substrate and the display panel, by overlapping a part of the second connection segment of the active layer with the data line, another part of the second connection segment locating between the two adjacent data lines, the third connection segment locating between the two adjacent data lines, area of the part of the active layer exposed between the two adjacent data lines can be increased, the part of the drain electrode and the active layer exposed between the two adjacent data lines contact with each other, thereby increasing contact area between the drain electrode and the active layer, reducing contact resistance between the drain electrode and the active layer, and effectively improving responding speed of the thin film transistor.

BRIEF DESCRIPTION OF THE SEVERAL VIEWS OF THE DRAWINGS

In order to more clearly illustrate the technical solutions in the embodiments of the present application, the accompanying drawings that need to be used in the description of the embodiments will be briefly introduced below. Obviously, the drawings in the following description are only some embodiments of the present application, for those skilled in the art, other drawings can also be obtained from these drawings without creative effort.

DESCRIPTION OF SPECIFIC EMBODIMENTS OF THE INVENTION

Figure 1:
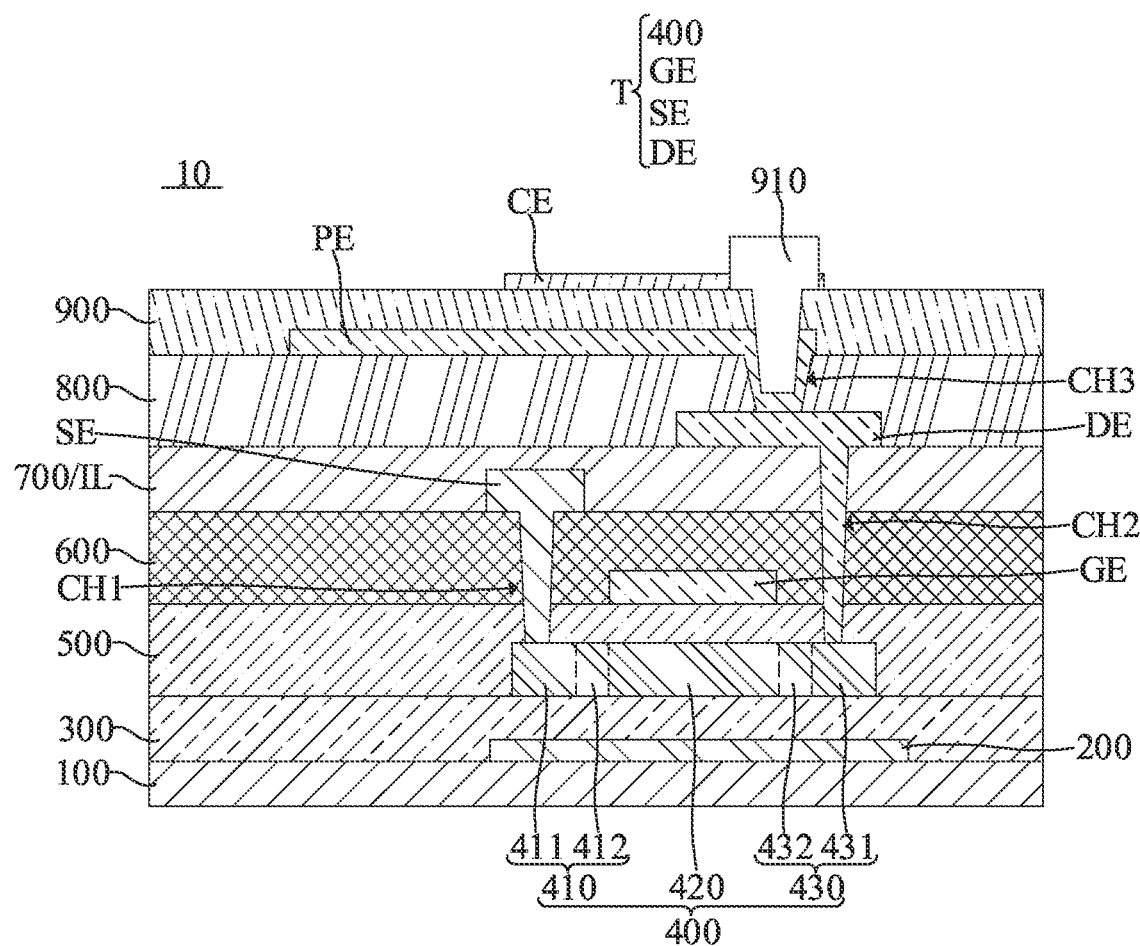
FIG. 1 is a schematic cross-sectional structural diagram of a first type of array substrate provided by an embodiment of the present application.

The technical solutions in the embodiments of the present application will be clearly and completely described below with reference to the drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application. In addition, it should be understood that the specific embodiments described herein are only used to illustrate and explain the present application, but not to limit the present application. In the present application, unless otherwise stated, the directional words used such as "upper" and "lower" generally refer to the upper and lower sides of the device in actual use or working state, specifically the drawing direction in the accompanying drawings; while "inside" and "outside" refer to the outline of the device.

Embodiments of the present application provide an array substrate and a display panel. Each of them will be described in detail below. It should be noted that the description order of the following embodiments is not intended to limit the preferred order of the embodiments.

Figure 2:
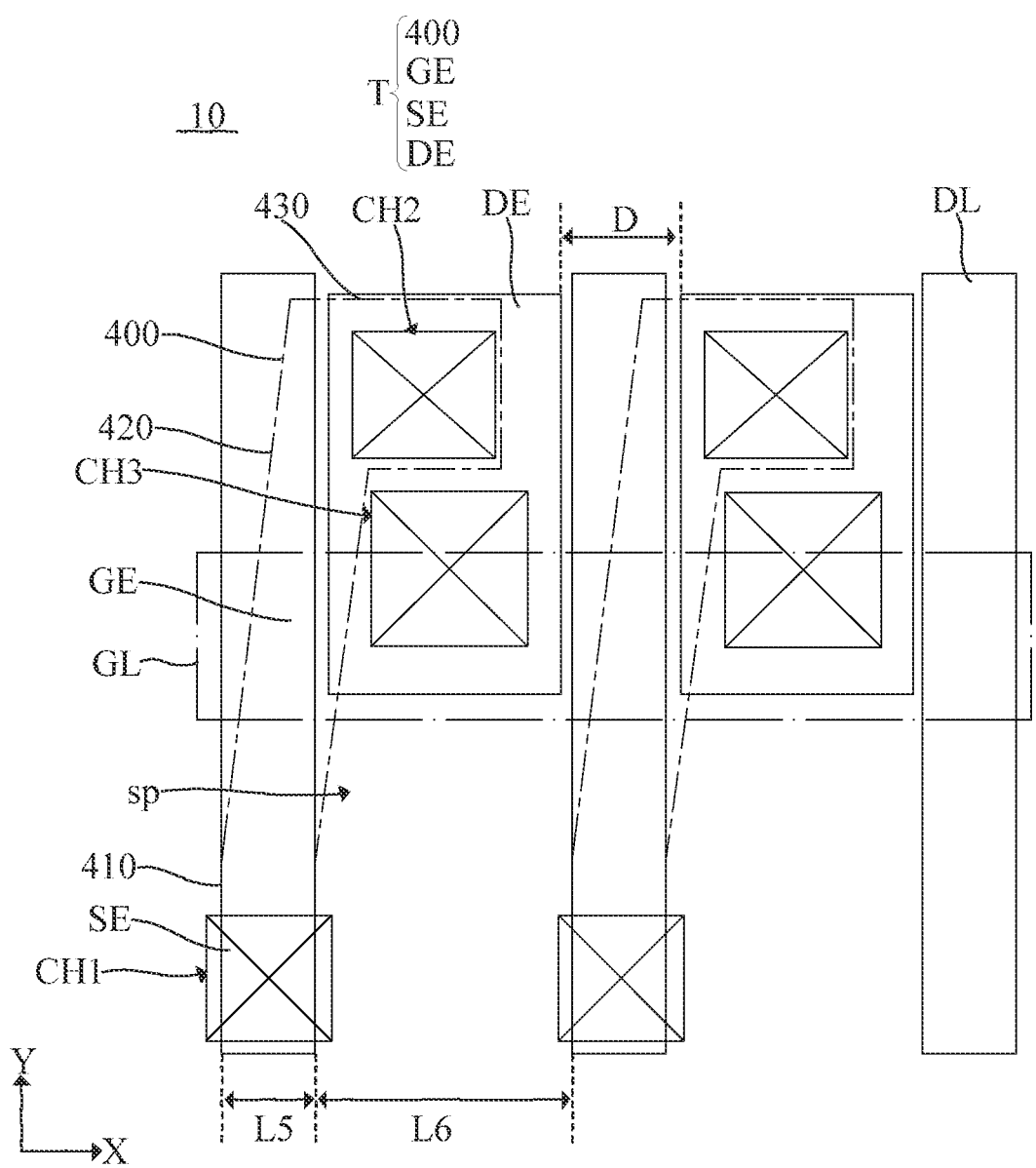
FIG. 2 is a plan schematic structural diagram 1 of a plane structure of an array substrate provided by an embodiment of the present application.
Figure 3:
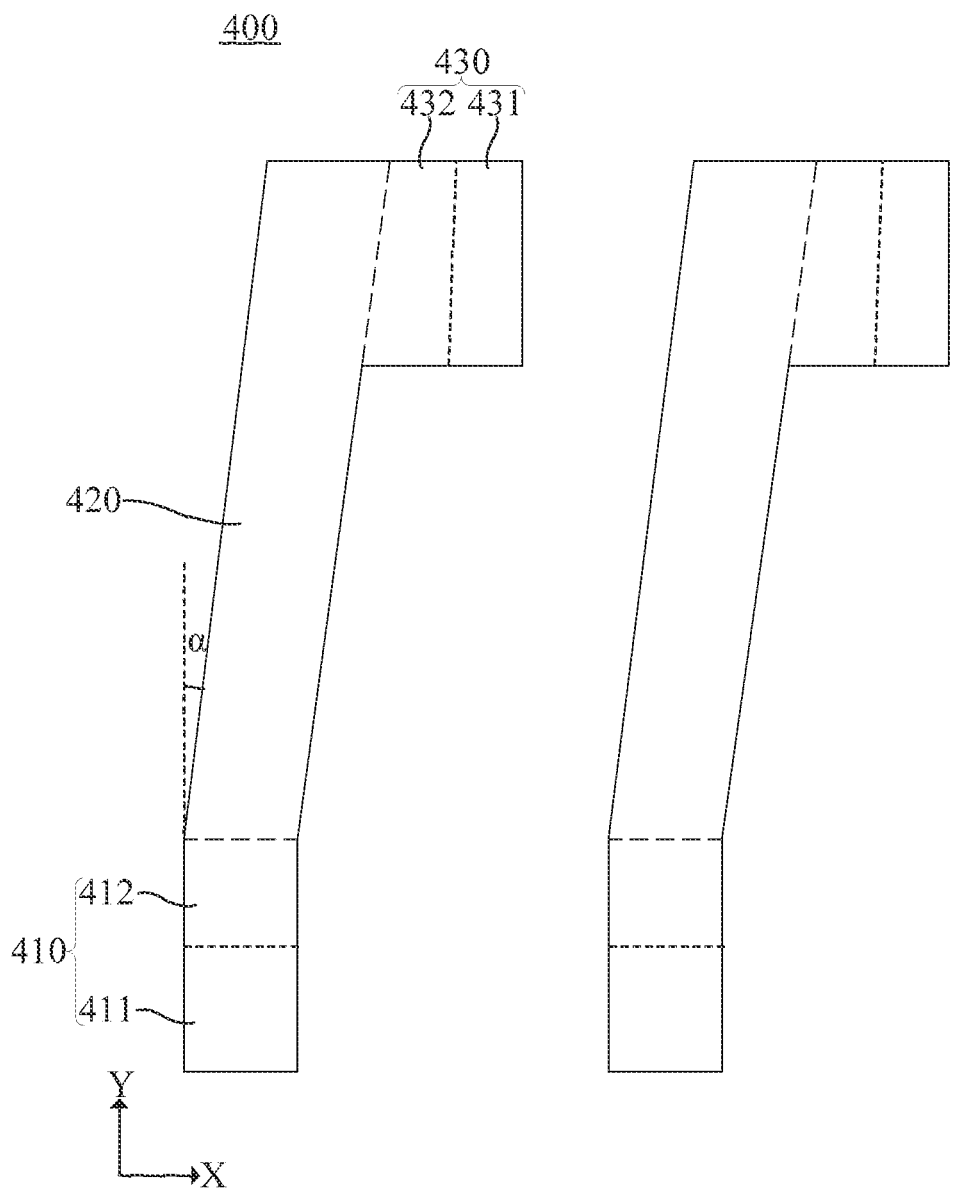
FIG. 3 is a plan schematic structural diagram of a first active layer provided by an embodiment of the present application.

Referring to FIG. 1 to FIG. 3, an embodiment of the present application provides an array substrate 10 including a plurality of data lines DL and source electrodes SE; the plurality of data lines DL are arranged at intervals along a first direction X, and the data lines DL extend along a second direction Y. The first direction X intersects with the second direction Y, the first direction X and the second direction Y may specifically, but not be limited to, be vertically arranged. The source electrode SE connects with the data line DL, that is, the source electrode SE contacts the data line DL, and that is, the source electrode SE electrically connects with the data line DL, each data line DL may connect with one or more source electrodes SE.

As shown in FIG. 1 to FIG. 3, the array substrate 10 further includes an active layer 400 disposed in a different layer from the data lines DL, that is, the active layer 400 and the data lines DL locate in different layer structures. The active layer 400 includes a first connection segment 410, a second connection segment 420, and a third connection segment 430 connected in sequence. The second connection segment 420 connects with the first connection segment 410 and the third connection segment 430. The first connection segment 410 contacts the source electrode SE, that is, the first connection segment 410 electrically connects with the source electrode SE. The first connection segment 410 overlaps with the data line DL in a direction perpendicular to the array substrate 10. The second connection segment 420 partially overlaps with the data line DL in the direction perpendicular to the array substrate 10, that is, a part of the second connection segment 420 overlaps with the data line DL in the direction perpendicular to the array substrate 10, and another part of the second connection segment 420 locates between two adjacent data lines DL. In the present embodiment of the present application, by overlapping the part of the second connection segment 420 with the data line DL in the direction perpendicular to the array substrate 10, a shading area of the array substrate 10 can be reduced. By extending another part of the second connection segment 420 between the two adjacent data lines DL, area of the part of the active layer 400 exposed between the two adjacent data lines DL can be increased. The third connection segment 430 locates between the two adjacent data lines DL, and the part of the second connection segment 420 extending between the two adjacent data lines DL and the third connection segment 430 are exposed between the two adjacent data lines DL.

As shown in FIG. 1 to FIG. 3, the array substrate 10 further includes a gate electrode GE and a drain electrode DE. The gate electrode GE, the data lines DL, and the active layer 400 are disposed in different layers, the gate electrode GE overlaps with the active layer 400 in the direction perpendicular to the array substrate 10. The drain electrode DE is arranged at interval with the data line DL and the source electrode SE. The drain electrode DE overlaps with the part of the active layer 400 exposed between the two adjacent data lines DL in the direction perpendicular to the array substrate 10. The drain electrode DE contacts the part of the active layer 400 exposed between the two adjacent data lines DL, that is, the drain electrode DE electrically connects the part of the active layer 400 exposed between the two adjacent data lines DL.

The array substrate 10 of the embodiment of the present application is provided with a thin film transistor T, and the thin film transistor T includes the above-mentioned active layer 400, gate electrode GE, source electrode SE, and drain electrode DE. In order to reduce the shading area of the array substrate 10 as much as possible, a part of the second connection segment 420 and the first connection segment 410 overlap with the data line DL in the direction perpendicular to the array substrate 10 of the present application. Since size of the thin film transistor T is very small, if only the third connection segment 430 contacts the drain electrode DE, a contact area between the drain electrode DE and the active layer 400 is small, which will cause contact resistance between the drain electrode DE and the active layer 400 to be high and reduce a responding speed of the thin film transistor T. In order to prevent the above problems, by exposing the another part of the second connection segment 420 between the two adjacent data lines DL of the present application, that is, extending the second connection segment 420 between the two adjacent data lines DL, so that the part of the second connection segment 420 extending between the two adjacent data lines DL and the third connection segment 430 are exposed between the two adjacent data lines DL, the drain electrode DE contacts the part of the active layer 400 exposed between the two adjacent data lines DL, so as to increase the contact area between the drain electrode DE and the active layer 400, reduce the contact resistance between the drain electrode DE and the active layer 400, and effectively improve the responding speed of the thin film transistor T.

Specifically, as shown in FIG. 2 to FIG. 5, an extending direction of the first connection segment 410 is same as an extending direction of the data line DL, and an extending direction of the third connection segment 430 intersects with the extending direction of the data line DL. Specifically, the extending direction of the first connection segment 410 is the second direction, and the extending direction of the third connection segment is the first direction.

Specifically, as shown in FIG. 2 and FIG. 3, the second connection segment 420 is linear, an extending direction of the second connection segment 420 intersects with the extending direction of the data line DL, that is, the second connection segment 420 is inclined relative to the data line DL, so that a part of the second connection segment 420 overlaps with the data line DL in the direction perpendicular to the array substrate 10, and the another part of the second connection segment 420 locates between the two adjacent data lines DL.

Specifically, in the embodiment shown in FIG. 3, the second connection segment 420 is linear, and the second connection segment 420 is inclined relative to the data line DL. If an included angle α between the extending direction of the second connection segment 420 and the extending direction of the data line DL is too small, the contact area between the drain electrode DE and the active layer 400 cannot be well improved. If the included angle α between the extending direction of the second connection segment 420 and the extending direction of the data line DL is too large, an area of the part of the active layer 400 exposed between the two adjacent data lines DL is too large, which affects an aperture ratio of the array substrate 10. In order to solve the above problems, the included angle α between the extending direction of the second connection segment 420 and the extending direction of the data line DL should be controlled at 7°-22°, which can effectively improve the contact area between the drain electrode DE and the active layer 400 and can ensure the aperture ratio of the array substrate 10. In the present embodiment, the included angle α between the extending direction of the second connection segment 420 and the extending direction of the data line DL may be 7°, 10°, 12°, 14°, 16°, 18°, 20°, or 22°. Of course, the angle α between the extending direction of the second connection segment 420 and the extending direction of the data line DL can be adjusted appropriately according to actual selections and specific requirements, which is not limited here.

It can be understood that the second connection segment 420 can be arranged in a manner shown in FIG. 3, and the second connection segment 420 can also be arranged in other manners, as long as it is ensured that a part of the second connection segment 420 overlaps with the data line DL in the direction perpendicular to the array substrate 10, and the another part of the second connection segment 420 locates between the two adjacent data lines DL. For example, the second connection segment 420 may also be arranged in a manner shown in FIG. 4 and FIG. 5, which is not limited here.

Figure 4:
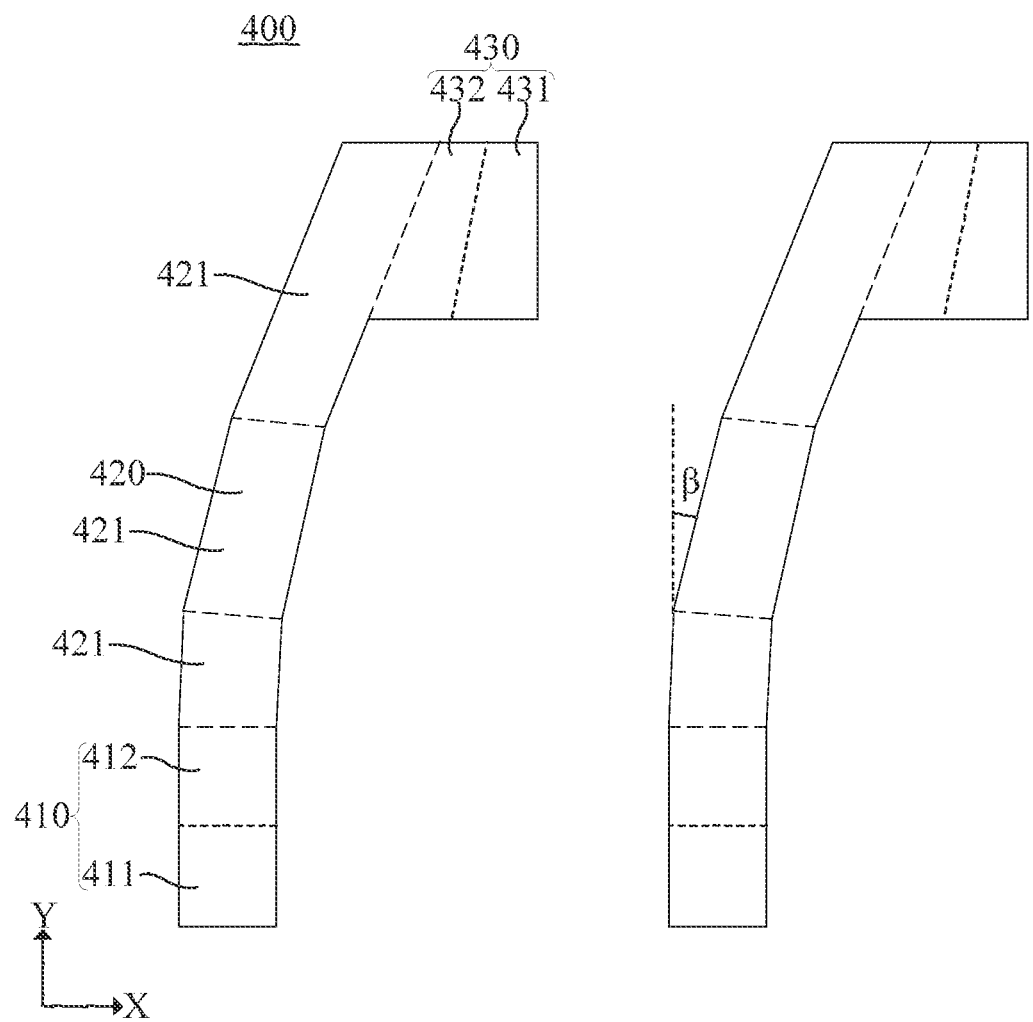
FIG. 4 is a plan schematic structural diagram of a second active layer provided by an embodiment of the present application.

Specifically, as shown in FIG. 2 and FIG. 4, the second connection segment 420 may include a plurality of sub-connection segments 421 connected in sequence. In the present embodiment, the second connection segment 420 includes three sub-connection segments 421. Of course, according to actual selection and specific requirements, the second connection segment 420 may include two, four, or more sub-connection segments 421, and a specific number of sub-connection segments 421 can be adjusted appropriately, which is not limited here.

Specifically, as shown in FIG. 2 and FIG. 4, the sub-connection segment 421 is linear, and an extending direction of the sub-connection segment 421 intersects with the extending direction of the data line DL, that is, the sub-connection segment 421 is inclined relative to the data line DL. A part of each sub-connection segment 421 overlaps with the data line DL in the direction perpendicular to the array substrate 10, and another part of the sub-connection segment 421 locates between the two adjacent data lines DL, so that the part of the second connection segment 420 overlaps with the data line DL in the direction perpendicular to the array substrate 10, and the another part of the second connection segment 420 locates between the two adjacent data lines DL. Of course, the sub-connection segment 421 can also be arc-shaped according to actual selections and specific requirements, which is not limited here.

Specifically, as shown in FIG. 2 and FIG. 4, there is an inclined angle β between the extending direction of the sub-connection segment and the extending direction of the data line. If the inclined angle β of the sub-connection segment 421 is too small, the contact area between the drain electrode DE and the active layer 400 cannot be well improved. If the inclined angle β of the sub-connection segment 421 is too large, the area of the part of the active layer 400 exposed between the two adjacent data lines DL is too large, which affects the aperture ratio of the array substrate 10. In order to solve the above problems, the inclined angle β of the sub-connection segment 421 should be controlled at 7°-22°, which can not only effectively increase the contact area between the drain electrode DE and the active layer 400, but also ensure the aperture ratio of the array substrate 10. In the present embodiment, the inclined angle β of the sub-connection segment 421 may be 7°, 10°, 12°, 14°, 16°, 18°, 20°, or 22°. Of course, according to the selection of the actual situation and the setting of specific requirements, the inclined angle β of the sub-connection segment 421 can be adjusted appropriately, which is not limited here.

Specifically, as shown in FIG. 2 and FIG. 4, the inclined angles θ of the plurality of sub-connection segments 421 gradually increase in a direction from the first connection segment 410 toward the third connection segment 430. In this structure, in the direction from the first connection segment 410 to the third connection segment 430, an area ratio of the part of the sub-connection segment 421 extending between the two adjacent data lines DL to the corresponding sub-connection segment 421 gradually increases. For further description, in the active layer 400 shown in the embodiment of FIG. 4, the second connection segment 420 includes three sub-connection segments 421, which are the first sub-connection segment 421, the second sub-connection segment 421, and the third sub-connection segment 421 in sequence in the direction from the first connection segment 410 to the third connection segment 430. The area ratio of the part of the first sub-connection segment 421 extending between the two adjacent data lines DL to a the first sub-connection segment 421 is smaller than the area ratio of the second sub-connection segment 421 extending between the two adjacent data lines DL to the second sub-connection segment 421. The area ratio of the part of the second sub-connection segment 421 extending between the two adjacent data lines DL to the second sub-connection segment 421 is smaller than the third sub-connection segment 421 extending between the two adjacent data lines DL to the third sub-connection segment 421.

During an actual manufacturing process of the array substrate 10, the drain electrode DE will contact the active layer 400 below the drain electrode DE through a contact hole. In order to prevent the drain electrode DE from conducting with other traces, the contact hole will be made relatively small. The contact hole cannot completely expose the part of the active layer 400 exposed between the two adjacent data lines DL, and an edge portion of the active layer 400 corresponding to the data line DL cannot be exposed in the contact hole. Therefore, part of the active layer 400 closer to the drain electrode DE is more likely to contact the drain electrode DE. In the active layer 400 of the embodiment of the present application, the inclined angles θ of the plurality of sub-connection segments 421 gradually increase in the direction from the first connection segment 410 to the third connection segment 430. Part of the sub-connection segment 421 that is farther away from the drain electrode DE and exposed between two adjacent data lines DL has a lower probability of contacting the drain electrode DE. Setting the inclined angle β of the sub-connection segment 421 to be smaller can reduce the area of the sub-connection segment 421 exposed between two adjacent data lines DL. The part of the sub-connection segment 421 exposed between the two adjacent data lines DL and closer to the drain electrode DE has a higher probability of contacting the drain electrode DE. Setting the part of the inclined angle β of the sub-connection segment 421 to be larger can increase the area of the sub-connection segment 421 exposed between the two adjacent data lines DL. Through the above setting, size of the active layer 400 can be controlled within a suitable size range, which can not only ensure a miniaturized design of the active layer 400, but also reduce the contact resistance between the drain electrode DE and the active layer 400, effectively improve the responding speed of the thin film transistor T.

Figure 5:
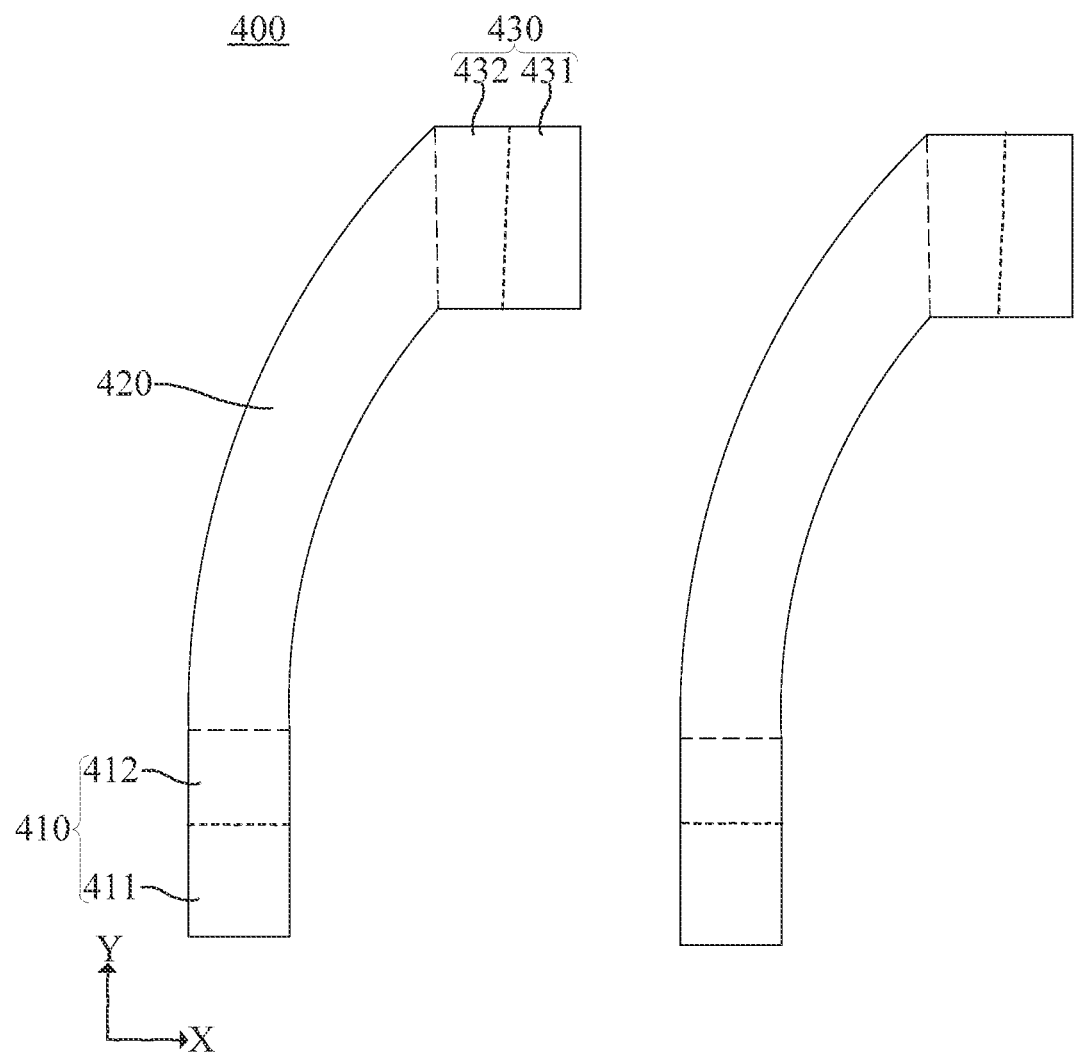
FIG. 5 is a plan schematic structural diagram of a third active layer provided by an embodiment of the present application.

Specifically, as shown in FIG. 2 and FIG. 5, the second connection segment 420 is arc-shaped so that a part of the second connection segment 420 overlaps with the data line DL in the direction perpendicular to the array substrate 10. Another part of the second connection segment 420 locates between two adjacent data lines DL. In the present embodiment, the second connection segment 420 may be formed by one arc, two arcs, or more arcs, which is not limited here.

Figure 6:
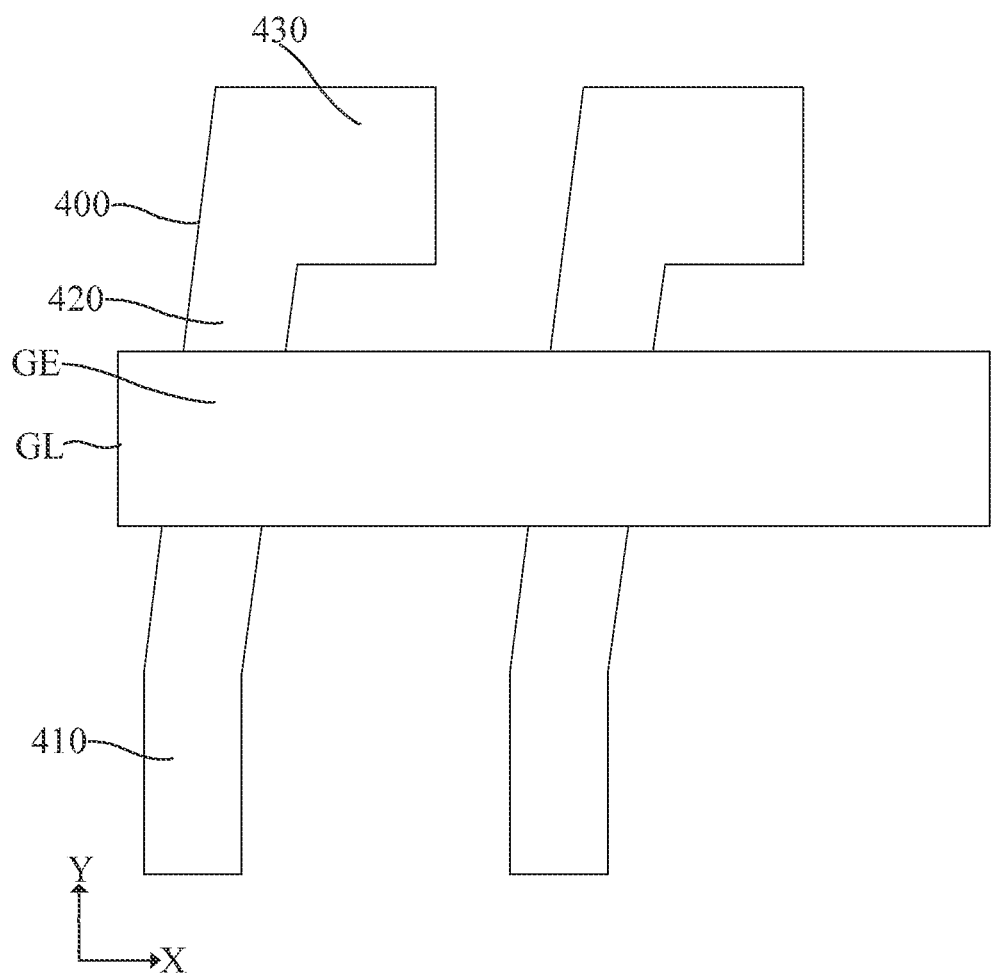
FIG. 6 is a plan schematic structural diagram of an active layer, a scan line, and a gate electrode after overlapping together provided by an embodiment of the present application.

Specifically, as shown in FIG. 1, FIG. 2, and FIG. 6, the array substrate 10 further includes a plurality of gate lines GL, the gate lines GL and the gate electrode GE are arranged in a same layer and connected with each other, that is, the gate electrodes GE contact the gate lines GL, and that is, the gate electrode GE electrically connects with the gate lines GL. The plurality of gate lines GL are arranged at intervals along the second direction Y, and the gate lines GL extend along the first direction X. The gate lines GL intersect with the data lines DL, and the plurality of gate lines GL and the plurality of data lines DL define a plurality of sub-pixel regions sp. A part of the second connection segment 420 overlaps with the data line DL in the direction perpendicular to the array substrate 10. Wherein, combined with FIG. 4, when the second connection segment 420 includes the plurality of sub-connection segments 421, the part of each sub-connection segment 421 overlaps with the data line DL in the direction perpendicular to the array substrate 10.

Figure 7:
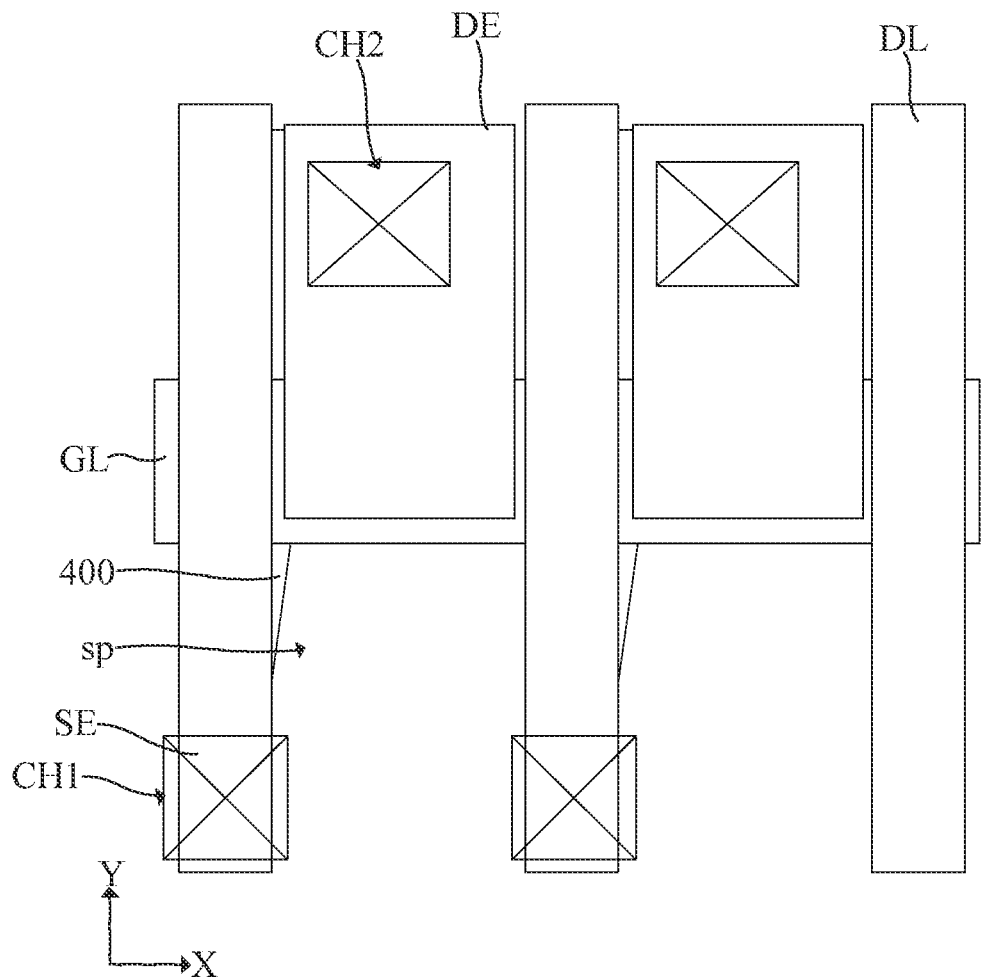
FIG. 7 is a plan schematic structural diagram of an active layer, a scan line, a gate electrode, a data line, a source electrode, and a drain electrode after overlapping together provided by an embodiment of the present application.

Specifically, as shown in FIG. 1, FIG. 2, and FIG. 7, the source electrode SE overlaps with the first connection segment 410 in the direction perpendicular to the array substrate 10, and the source electrode SE contacts the first connection segment 410. The drain electrode DE overlaps with the third connection segment 430 in the direction perpendicular to the array substrate 10, and the drain electrode DE contacts the third connection segment 430. The gate electrode GE overlaps with the second connection segment 420 in the direction perpendicular to the array substrate 10, and the gate electrode GE and the active layer 400 are arranged at interval. In this structure, the gate electrode GE, the active layer 400, the source electrode SE, and the drain electrode DE form the thin film transistor T.

Specifically, as shown in FIG. 1 to FIG. 5, the first connection segment 410 includes a first ion heavily doped region 411 and a first ion lightly doped region 412. The first ion lightly doped region 412 is disposed between the first ion heavily doped region 411 and the second connection segment 420. Ion doping concentration of the first heavily ion doped region 411 is higher than ion doping concentration of the first ion lightly doped region. The source electrode SE contacts the first ion heavily doped region 411. In this structure, characteristics such as carrier mobility and high output currents of the thin film transistor T can be improved.

Specifically, as shown in FIG. 1 to FIG. 5, the third connection segment 430 includes a second ion heavily doped region 431 and a second ion lightly doped region 432. The second ion lightly doped region 432 is disposed between the second ion heavily doped region 431 and the second connection segment 420. Ion doping concentration of the second ion heavily doped region 431 is higher than ion doping concentration of the second ion lightly doped region. The drain electrode DE contacts the second ion heavily doped region 431. In this structure, the characteristics such as the carrier mobility and the high output currents of the thin film transistor T can be improved.

Specifically, as shown in FIG. 1 to FIG. 5, doped ions of the first ion heavily doped region 411, the first ion lightly doped region 412, the second ion heavily doped region 431, and the second ion lightly doped region 432 can be N-type doped ions. The N-type doped ions can specifically include elements such as phosphorus and arsenic. Of course, according to the actual selection and specific requirements, the doped ions of the first ion heavily doped region 411, the first ion lightly doped region 412, the second ion heavily doped region 431, and the second ion lightly doped region 432 can be P-type doped ions. The P-type doped ions can specifically include elements such as boron and gallium.

Figure 8:
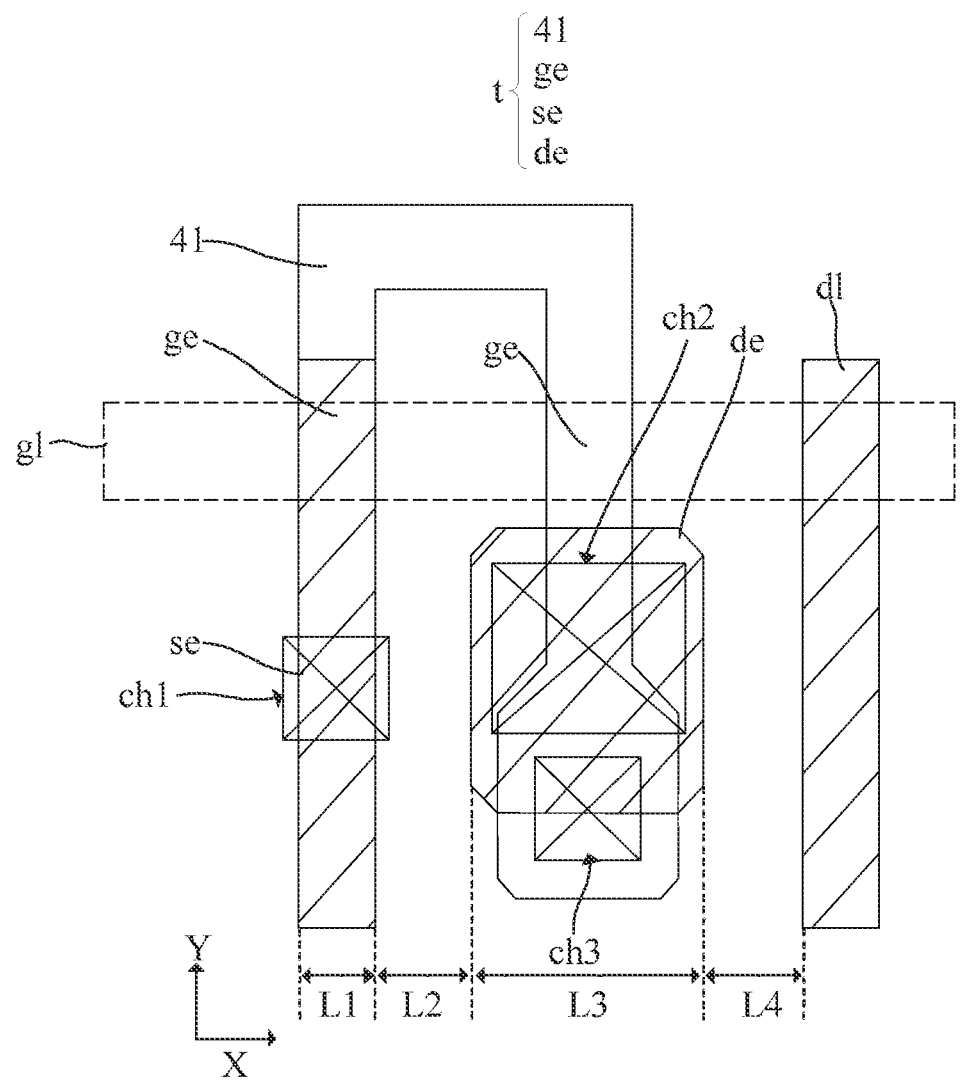
FIG. 8 is plan schematic structural diagram of an array substrate provided by a comparative example of the present application.

FIG. 8 is an array substrate provided by a comparative embodiment of the present application, and the array substrate includes a data line d1, a scan line gl, a thin film transistor t, and a pixel electrode (not shown). The thin film transistor t is a double-gate thin film transistor t. The thin film transistor t includes an active layer 41, two gate electrodes ge, a source electrode se, and a drain electrode de. Wherein the active layer 41 is U-shaped, the gate line is disposed above the active layer 41. The data line d1, the source electrode se, and the drain electrode de are disposed in a same layer. The source electrode se connects with one end of the active layer 41 through a first contact hole ch1. The drain electrode de locates between two adjacent data lines d1, the drain electrode de connects with another end of the active layer 41 through a second contact hole ch2, the drain electrode de also connects with the pixel electrode through a third contact hole ch3. As shown in FIG. 8, in order to preventshort circuit between the drain electrode de and the data line d1, a definite distance needs to be maintained between the drain electrode de and the data line d1, which will increase pixel pitches and be not conducive to improvement of resolution. Specifically, a width of the data line d1 is L1, and a distance between the drain electrode de and an adjacent data line d1 is L2; a width of the drain electrode de is L3, and a distance between the drain electrode de and another adjacent data line d1 is L4. A width of a sub-pixel region formed by a data line d1, a transistor electrically connected with the data line d1, a pixel electrode, and the like is L1+L2+L3+L4. Limited by process capability of panel exposure, a minimum data line d1 that can be made is only about 1.5 microns, and a minimum contact hole size is about 2 microns to 5 microns, resulting in a minimum value of L1+L2+L3+L4 being 7 microns-8 microns, and correspondingly, maximum resolution only reaching about 1000 ppi; the resolution of about 1000 ppi cannot meet needs of virtual reality technology immersion.

Specifically, as shown in FIG. 1 and FIG. 2, in the array substrate 10 of the embodiment of the present application, the source electrode SE and the data line DL are disposed in the same layer, and the drain electrode DE and the data line DL are disposed in different layers. In addition, an insulating layer IL is provided between the drain electrode DE and the data line DL, that is, the drain electrode DE and the data line DL are located in different layer structures, and the drain electrode DE and the data line DL are not short-circuited. In actual production process, it is not necessary to consider whether a safe distance needs to be maintained between the drain electrode DE and the data lines DL, and it is only necessary to ensure that a definite distance D is maintained between the two adjacent drain electrode DE. In the present embodiment, a distance between the adjacent data lines DL is L5, the distance between the two adjacent data lines DL is L6, and a width of the sub-pixel region sp is L5+L6. Under the existing process capability, a minimum value of L5+L6 can be about 4 microns. Since the width of the sub-pixel region sp is greatly reduced, the resolution can be increased to more than 1500 ppi, and the resolution can even reach more than 2000, thereby significantly improving the resolution of the display panel and meeting demand for high resolution in field of virtual reality. In addition, in the array substrate 10 of the embodiment of the present application, the thin film transistor T has a single-gate structure. Compared with the array substrate 10 shown in FIG. 8, the array substrate 10 of the embodiment of the present application has a larger aperture ratio.

Specifically, as shown in FIG. 1 and FIG. 2, the array substrate 10 further includes a substrate 100, a gate insulating layer 500, a first interlayer insulating layer 600, and a second interlayer insulating layer 700. The active layer 400 is disposed on the substrate 100, and the gate insulating layer 500 covers the active layer 400; the gate electrode GE is disposed on the gate insulating layer 500, and the first interlayer insulating layer 600 covers the gate electrode GE; the source electrode SE is disposed on the first interlayer insulating layer 600, the second interlayer insulating layer 700 covers the source electrode SE, and the drain electrode DE is disposed on the second interlayer insulating layer 700. In this structure, by arranging the source electrode SE (data line DL) and the drain electrode DE on different layer structures, it is beneficial to reduce the width of the sub-pixel region sp, thereby significantly improving the resolution of the display panel.

Specifically, as shown in FIG. 1 and FIG. 2, the gate insulating layer 500 and the first interlayer insulating layer 600 are provided with a first via hole CH1, and the source electrode SE contacts the first connection segment 410 of the active layer 400 through the first via hole CH1. Specifically, the source electrode SE contacts the first ion heavily doped region 411 through the first via hole CH1, so that the source electrode SE electrically connects with the active layer 400. The gate insulating layer 500, the first interlayer insulating layer 600, and the second interlayer insulating layer 700 are provided with a second via hole CH2; the drain electrode DE contacts the third connection segment 430 of the active layer 400 through the second via hole CH2. Specifically, the drain electrode DE contacts the second ion heavily doped region 431 through the second via hole CH2, so that the drain electrode DE electrically connects with the active layer 400.

Specifically, as shown in FIG. 1 and FIG. 2, the array substrate 10 further includes a first planarization layer 800, a pixel electrode PE, a protective layer 900, a common electrode CE, and a second planarization layer 910. The first planarization layer 800 covers the drain electrode DE and the second interlayer insulating layer 700. The pixel electrode PE is disposed on the first planarization layer 800 and contacts the drain electrode DE, that is, the pixel electrode PE electrically connects with the drain electrode DE. The protective layer 900 covers the pixel electrode PE and the first planarization layer 800, and the common electrode CE is disposed on the protective layer 900; the second planarization layer 910 is disposed on the protective layer 900 and the common electrode CE, and the second planarization layer 910 is used to fill a recessed area of the protective layer 900, thereby providing a flat area for spacers to stand.

Specifically, as shown in FIG. 1 and FIG. 2, the first planarization layer 800 is provided with a third via hole CH3, and the pixel electrode PE contacts the drain electrode DE through the third via hole CH3, that is, the pixel electrode PE electrically connects with the drain electrode DE.

Figure 9:
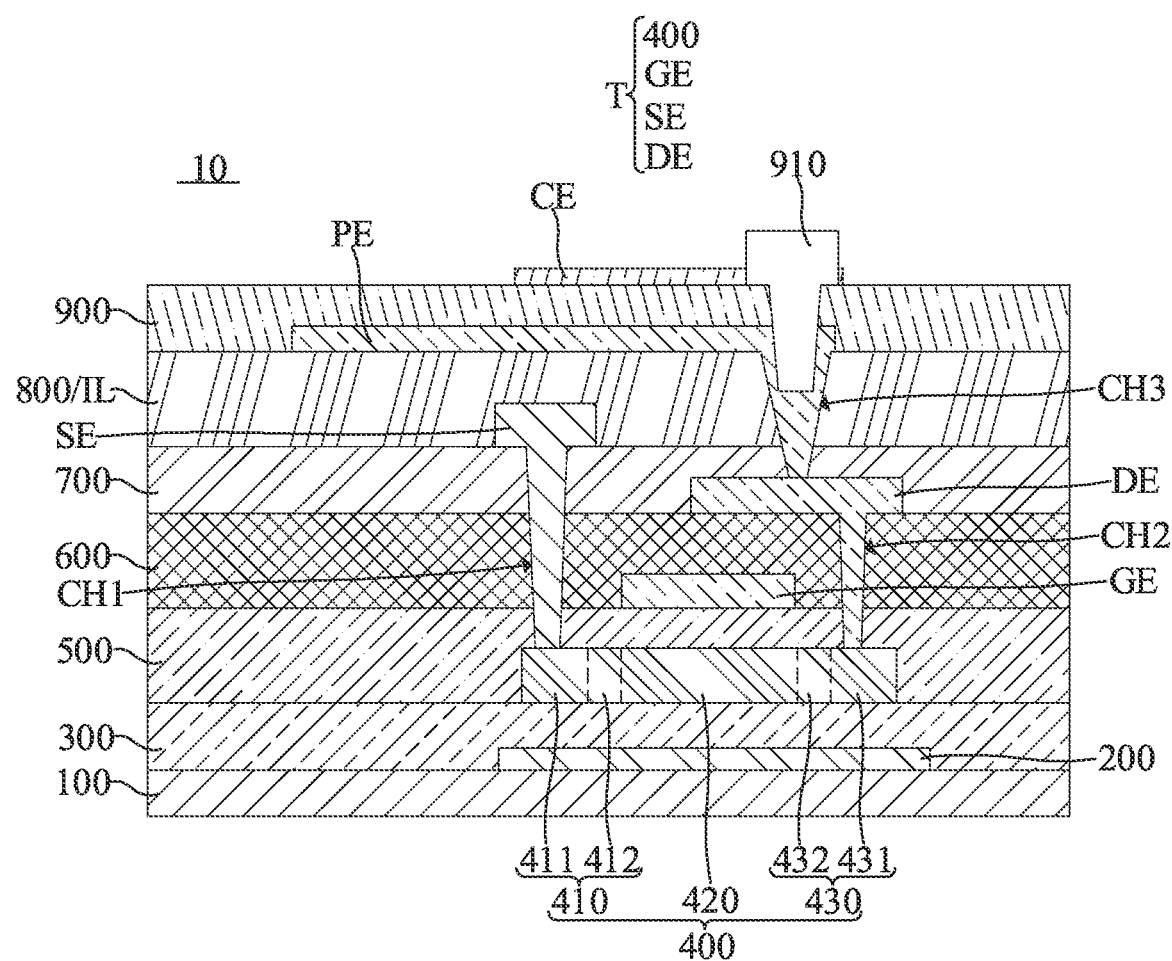
FIG. 9 is a schematic cross-sectional structural diagram of a second type of array substrate provided in an embodiment of the present application.

Specifically, as shown in FIG. 2 and FIG. 9, the array substrate 10 further includes a substrate 100, a gate insulating layer 500, a first interlayer insulating layer 600, and a second interlayer insulating layer 700. The active layer 400 is disposed on the substrate 100, and the gate insulating layer 500 covers the active layer 400; the gate electrode GE is disposed on the gate insulating layer 500, and the first interlayer insulating layer 600 covers the gate electrode GE; The drain electrode DE is disposed on the first interlayer insulating layer 600, the second interlayer insulating layer 700 covers the drain electrode DE, and the source electrode SE is disposed on the second interlayer insulating layer 700. In this structure, by arranging the source electrode SE (data line DL) and the drain electrode DE on different layer structures, it is beneficial to reduce the width of the sub-pixel region sp, thereby significantly improving the resolution of the display panel.

Specifically, as shown in FIG. 2 and FIG. 9, the gate insulating layer 500, the first interlayer insulating layer 600, and the second interlayer insulating layer 700 are provided with a first via hole CH1, and the source electrode SE contacts the first connection segment 410 of the active layer 400 through the first via hole CH1. Specifically, the source electrode SE contacts the first ion heavily doped region 411 through the first via hole CH1, so that the source electrode SE electrically connects with the active layer 400. The gate insulating layer 500 and the first interlayer insulating layer 600 are provided with a second via hole CH2; the drain electrode DE contacts the third connection segment 430 of the active layer 400 through the second via hole CH2. Specifically, the drain electrode DE contacts the second ion heavily doped region 431 through the second via hole CH2, so that the drain electrode DE electrically connects with the active layer 400.

Specifically, as shown in FIG. 1 and FIG. 9, the array substrate 10 further includes a first planarization layer 800, a pixel electrode PE, a protective layer 900, a common electrode CE, and a second planarization layer 910. The first planarization layer 800 covers the drain electrode DE and the second interlayer insulating layer 700. The pixel electrode PE is disposed on the first planarization layer 800 and contacts the drain electrode DE, that is, the pixel electrode PE electrically connects with the drain electrode DE. The protective layer 900 covers the pixel electrode PE and the first planarization layer 800, and the common electrode CE is disposed on the protective layer 900; the second planarization layer 910 is disposed on the protective layer 900 and the common electrode CE, and the second planarization layer 910 is used to fill a recessed area of the protective layer 900, thereby providing a flat area for spacers to stand.

Specifically, as shown in FIG. 2 and FIG. 9, the second interlayer insulating layer 700 and the first planarization layer 800 are provided with a third via hole CH3, and the pixel electrode PE contacts the drain electrode DE through the third via hole CH3, that is, the pixel electrode PE electrically connects with the drain electrode DE.

Specifically, as shown in FIG. 1 and FIG. 9, the array substrate 10 further includes a light shielding layer 200 and a buffer layer 300. The light shielding layer 200 is disposed on the substrate 100 and is disposed corresponding to the active layer 400, and the buffer layer 300 covers the light shielding layer 200 and the substrate 100. The active layer 400 is disposed on the buffer layer 300, and the gate insulating layer 500 covers the active layer 400 and the buffer layer 300.

Figure 10:
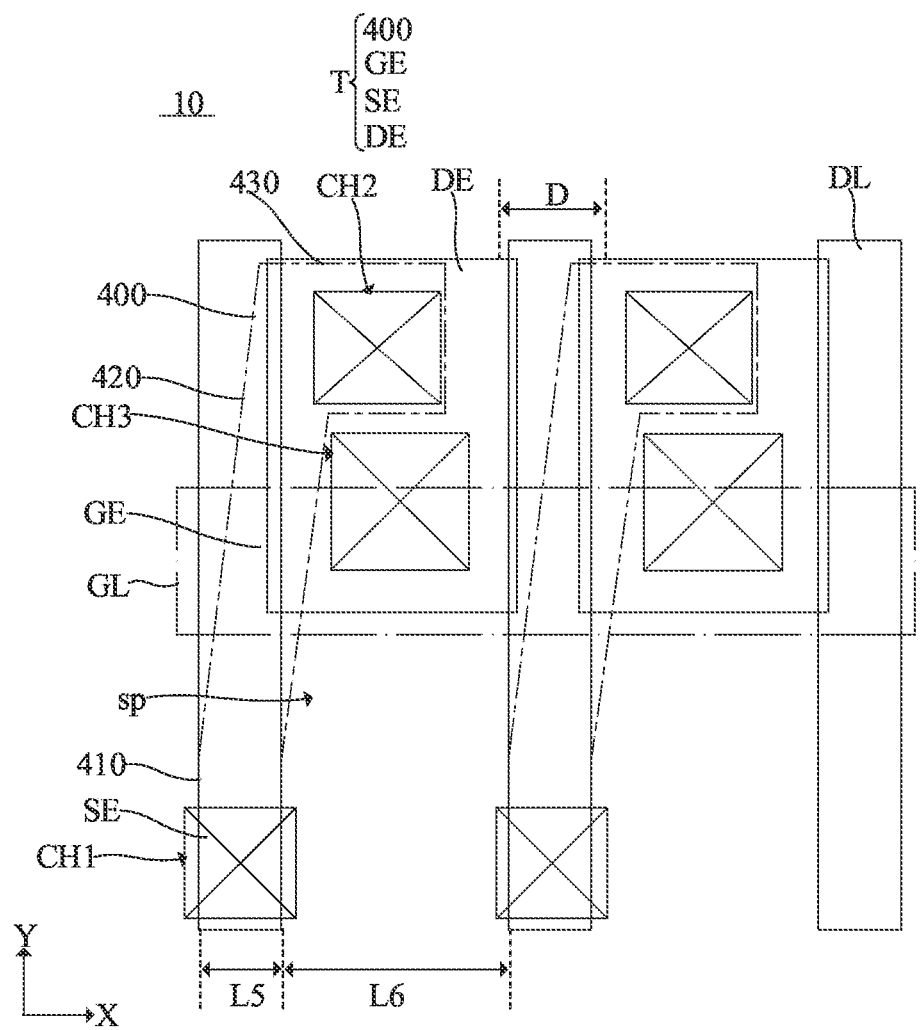
FIG. 10 is a schematic diagram 2 of the plane structure of the array substrate provided by the embodiment of the present application.

Specifically, as shown in FIG. 10, main differences between the embodiment shown in FIG. 10 and the embodiment shown in FIG. 2 are: in the array substrate 10 of the embodiment shown in FIG. 2, the drain electrode DE locates between the two adjacent data lines DL; in the array substrate 10 of the embodiment shown in FIG. 10, the part of the drain electrode DE overlaps with the adjacent data line DL in the direction perpendicular to the array substrate 10. In this structure, an overlapping area of the drain electrode DE and the part of the active layer 400 exposed between the two adjacent data lines DL can be increased, which is beneficial to increase the contact area between the drain electrode DE and the part of the active layer 400 exposed between the two adjacent data lines DL, thereby reducing the contact resistance between the drain electrode DE and the active layer 400, effectively improving the responding speed of the thin film transistor T.

It should be noted that, in the array substrate 10 of the embodiment of the present application, the thin film transistor T with a single gate structure is used, the drain electrode DE and the data line DL are arranged in different layer structures, so that the distance between the two adjacent data lines DL is less than 7 microns, which can greatly reduce the width of the sub-pixel region sp, which is beneficial to improve the resolution.

Figure 11:
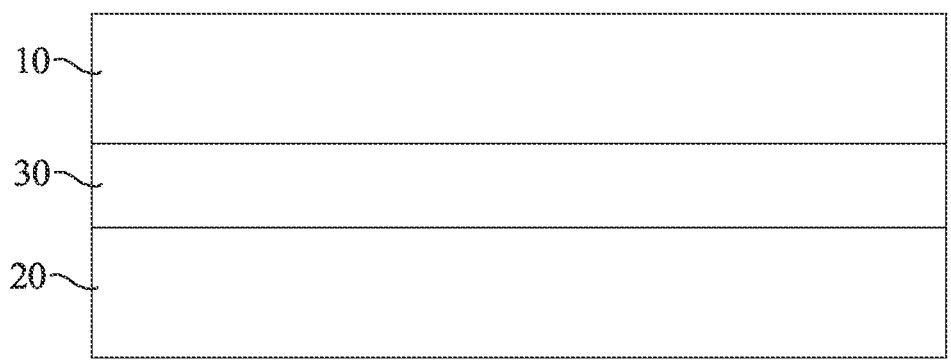
FIG. 11 is a schematic structural diagram of a display panel provided by an embodiment of the present application.

Referring to FIG. 11, an embodiment of the present application further provides a display panel including a liquid crystal layer 30, an opposite substrate 20, and the array substrate 10 as described above. The array substrate 10 and the opposite substrate 20 are disposed opposite to each other, and the liquid crystal layer 30 is disposed between the array substrate 10 and the opposite substrate 20. Since the display panel of the embodiment of the present application includes the technical solutions of all above-mentioned embodiments, it also has the beneficial effects of all above-mentioned technical solutions, which will not be repeated here.

The array substrate and the display panel provided by the embodiments of the present application have been described in detail above. The principles and implementations of the present application are described here using specific examples, and the descriptions of the above embodiments are only used to help understand the methods and core ideas of the present application. At the same time, for those skilled in the art, according to the idea of the present application, there will be changes in the specific embodiments and application scope. In summary, the content of the specification should not be construed as a limitation to the present application.

What is claimed is:

1. An array substrate, including:
a plurality of data lines;
an active layer arranged in a different layer from the data lines, the active layer including a first connection segment, a second connection segment, and a third connection segment connected in sequence, the first connection segment overlapping with the data lines in a direction perpendicular to the array substrate, the third connection segment locating between two adjacent data lines, the second connection segment connecting with the first connection segment and the third connection segment, and the second connection segment partially overlapping with the data lines in the direction perpendicular to the array substrate;
a gate electrode arranged in a different layer from the data lines and the active layer, the gate electrode overlapping with the active layer in the direction perpendicular to the array substrate;
a source electrode connecting with the data lines, the source electrode contacting the first connection segment; and
a drain electrode arranged at intervals from the data lines and the source electrode, the drain electrode overlapping with a part of the active layer exposed between the two adjacent data lines in the direction perpendicular to the array substrate, and the drain electrode contacting the part of the active layer exposed between the two adjacent data lines,
wherein the second connection segment includes a plurality of sub-connection segments connected in sequence, the sub-connection segments are linear, and extending directions of the sub-connection segments intersect with the extending direction of the data lines, inclined angles are formed between the extending directions of the sub-connection segments and the extending direction of the data lines, and the inclined angles of the plurality of sub-connection segments gradually increase from a direction of the first connection segment toward the third connection segment.

2. The array substrate as claimed in claim 1, wherein the second connection segment is linear, and an extending direction of the second connection segment intersects with an extending direction of the data lines.

3. The array substrate as claimed in claim 2, wherein an included angle between the extending direction of the second connection segment and the extending direction of the data lines is 7°-22°.

4. The array substrate as claimed in claim 1, wherein an area ratio of parts of the sub-connection segments extending between the two adjacent data lines to corresponding sub-connection segments gradually increases from direction of the first connection segment toward the third connection segment.

5. The array substrate as claimed in claim 1, wherein included angles between the extending directions of the sub-connection segments and the extending direction of the data lines are 7°-22°.

6. The array substrate as claimed in claim 1, wherein the source electrode and the data lines are arranged in a same layer, and the drain electrode and the data lines are arranged in different layers.

7. The array substrate as claimed in claim 6, wherein the array substrate further includes a substrate, a gate insulating layer, a first interlayer insulating layer, and a second interlayer insulating layer; the active layer is disposed on the substrate, the gate insulating layer covers the active layer; the gate electrode is disposed on the gate insulating layer, the first interlayer insulating layer covers the gate electrode, and the source electrode is disposed on the first interlayer insulating layer; the second interlayer insulating layer covers the source electrode, and the drain electrode is disposed on the second interlayer insulating layer.

8. The array substrate as claimed in claim 7, wherein the gate insulating layer and the first interlayer insulating layer are provided with a first via hole, and the source electrode contacts the first connection segment through the first via hole;

the gate insulating layer, the first interlayer insulating layer, and the second interlayer insulating layer are provided with a second via hole, and the drain electrode contacts the third connection segment through the second via hole.

9. The array substrate as claimed in claim 7, wherein the array substrate further includes a first planarization layer, a pixel electrode, a protective layer, and a common electrode; the first planarization layer covers the drain electrode and the second interlayer insulating layer, the pixel electrode is disposed on the first planarization layer and contacts the drain electrode; the protective layer covers the pixel electrode and the first planarization layer, and the common electrode is disposed on the protective layer.

10. The array substrate as claimed in claim 9, wherein the first planarization layer is provided with a third via hole, and the pixel electrode contacts the drain electrode through the third via hole.

11. The array substrate as claimed in claim 6, wherein the array substrate further includes a substrate, a gate insulating layer, a first interlayer insulating layer, and a second interlayer insulating layer; the active layer is disposed on the substrate, the gate insulating layer covers the active layer; the gate electrode is disposed on the gate insulating layer, the first interlayer insulating layer covers the gate electrode, and the drain electrode is disposed on the first interlayer insulating layer; the second interlayer insulating layer covers the drain electrode, and the source electrode is disposed on the second interlayer insulating layer.

12. The array substrate as claimed in claim 11, wherein the gate insulating layer, the first interlayer insulating layer, and the second interlayer insulating layer are provided with a first via hole, and the source electrode contacts the first connection segment through the first via hole;

the gate insulating layer and the first interlayer insulating layer are provided with a second via hole, and the drain electrode contacts the third connection segment through the second via hole.

13. The array substrate as claimed in claim 11, wherein the array substrate further includes a first planarization layer, a pixel electrode, a protective layer, and a common electrode; the first planarization layer covers the source electrode and the second interlayer insulating layer, the pixel electrode is disposed on the first planarization layer and contacts with the drain electrode, the protective layer covers the pixel electrode and the first planarization layer, the common electrode is disposed on the protective layer.

14. The array substrate as claimed in claim 13, wherein the second interlayer insulating layer and the first planarization layer are provided with a third via hole, and the pixel electrode contacts the drain electrode through the third via hole.

15. The array substrate as claimed in claim 1, wherein a distance between the two adjacent data lines is less than 7 microns.

16. A display panel, including a liquid crystal layer, an opposite substrate, and the array substrate as claimed in claim 1, the array substrate and the opposite substrate arranged opposite to each other, and the liquid crystal layer disposed between the array substrate and the opposite substrate.

* * * * *